United States Patent [19]

Sandhu

[11] Patent Number: 5,657,189
[45] Date of Patent: Aug. 12, 1997

[54] HALL-EFFECT MAGNETIC SENSOR AND A THIN-FILM MAGNETIC HEAD USING SUCH A HALL-EFFECT MAGNETIC SENSOR

[75] Inventor: Adarsh Sandhu, Yokohama, Japan

[73] Assignee: Fujitsu Limited, Kawasaki, Japan

[21] Appl. No.: 503,609

[22] Filed: Jul. 18, 1995

[30] Foreign Application Priority Data

Sep. 19, 1994 [JP] Japan .................... 6-223812

[51] Int. Cl.$^6$ .................. G11B 5/37; H01L 29/82; G01R 33/06
[52] U.S. Cl. .................. 360/112; 257/421; 324/251
[58] Field of Search .................. 360/112, 125, 360/126, 113; 257/421–427; 324/251, 207.21

[56] References Cited

U.S. PATENT DOCUMENTS 5,093,753  3/1992  Friederich et al. ............. 360/112
5,543,988  8/1996  Brady et al. ............. 360/112

FOREIGN PATENT DOCUMENTS 2-97075  4/1990  Japan .

*Primary Examiner*—Stuart S. Levy
*Assistant Examiner*—Allen Cao
*Attorney, Agent, or Firm*—Armstrong, Westerman, Hattori, McLeland & Naughton

[57] ABSTRACT

A thin film magnetic head includes a layered semiconductor body formed of a quantum well layer sandwiched by first and second barrier layers, wherein at least one of the first and second barrier layers includes therein a delta-doped layer that shields the quantum well layer from a surface depletion region extending from the surface of the barrier layer.

6 Claims, 10 Drawing Sheets

FIG. 1A PRIOR ART
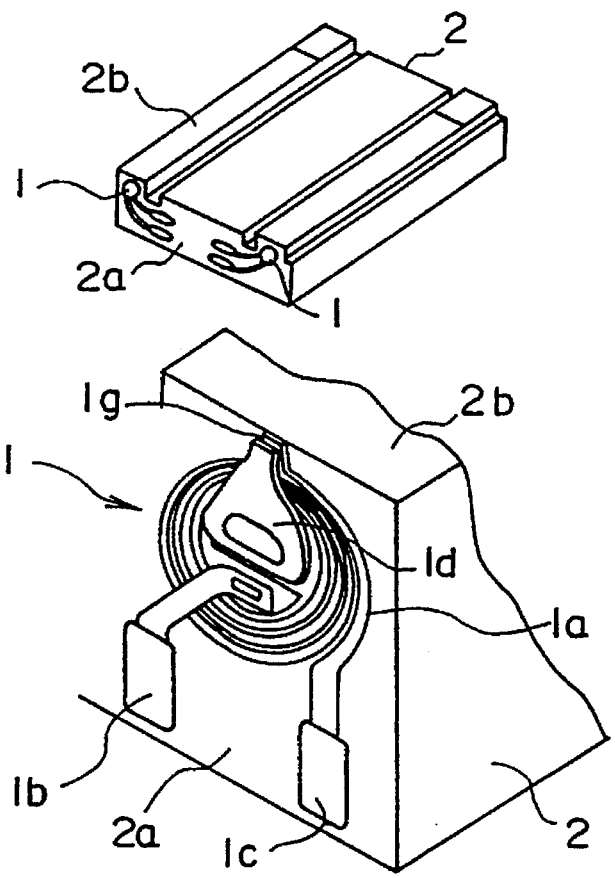
FIG. 1B PRIOR ART
FIG. 1C PRIOR ART
FIG. 1D PRIOR ART
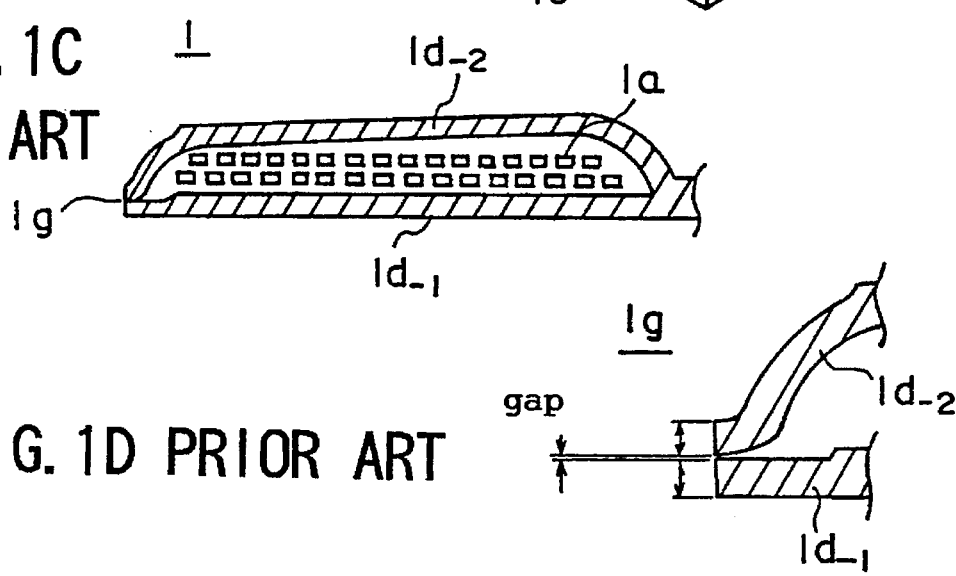

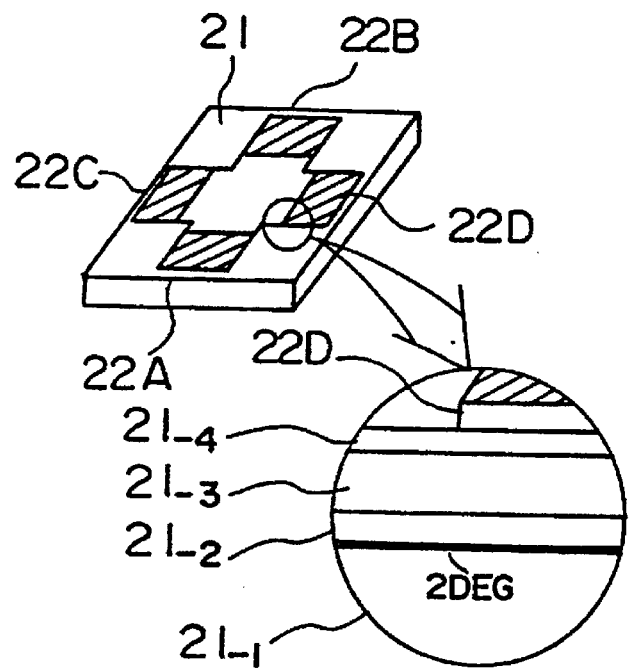
FIG. 2A PRIOR ART
FIG. 2B PRIOR ART
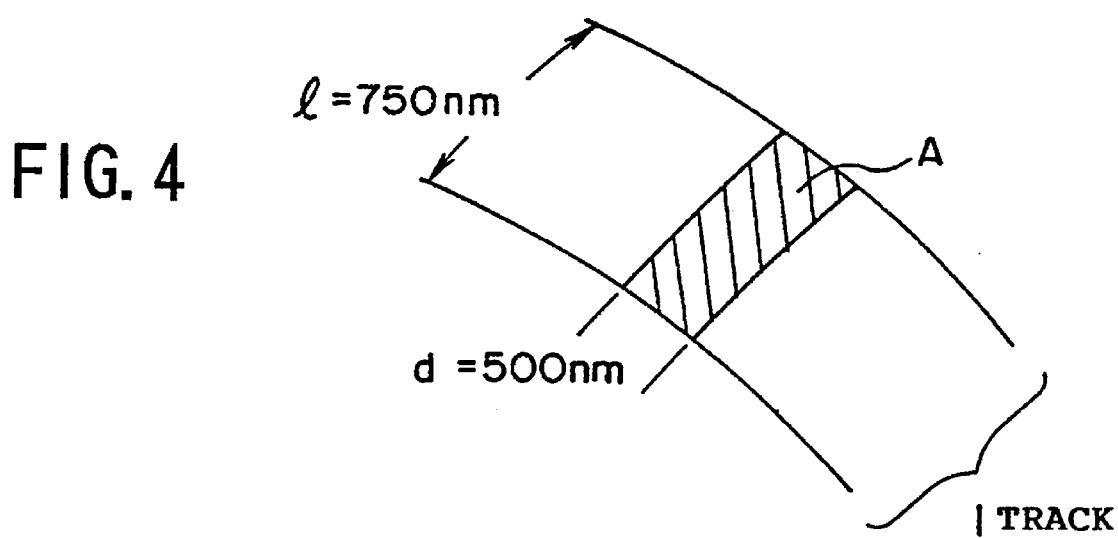
FIG. 4

HALL-EFFECT MAGNETIC SENSOR AND A THIN-FILM MAGNETIC HEAD USING SUCH A HALL-EFFECT MAGNETIC SENSOR

BACKGROUND OF THE INVENTION

The present invention generally relates to magnetic sensors and more particularly to a Hall-effect magnetic sensor and a magnetic head that uses such a magnetic sensor.

Magnetic heads are used extensively from audio-visual apparatuses such as video tape recorders and audio tape recorders to information processing apparatuses such as a personal computer. In the computers for use in the so-called multimedia applications, in particular, there is a ponderous demand for recording an enormous amount of information such as image data and audio data. Thus, in order to realize such a high speed, large capacity magnetic storage device, it is necessary to develop a high sensitivity and high resolution magnetic head that performs reading and writing with a correspondingly high resolution.

FIGS. 1A–1D show the construction of a conventional thin-film magnetic head 1 used in a conventional hard disk drive.

Referring to FIG. 1A, the magnetic head 1 is formed on a rear edge surface 2a of a carrier piece 2 that floats away from a recording surface of a revolving magnetic disk by an air foil. In order to create the necessary air foil, the carrier piece 2 is formed with a bearing surface 2b that forms a fluid bearing.

As indicated in FIG. 1B, a coil pattern 1a is formed on the foregoing rear edge surface 2a together with interconnection pads 1b and 1c provided at both ends of the coil pattern 1a. Further, a magnetic yoke 1d is formed also on the rear edge surface 2a. It should be noted that the magnetic yoke 1d forms a magnetic gap 1g such that the magnetic gap 1g is exposed at bearing surface 2b.

FIG. 1C shows the magnetic head 1 in a cross sectional view taken along a line that intersects the foregoing magnetic yoke 1d. It will be noted that the magnetic yoke 1d includes a lower pole piece $1d_1$ provided on the foregoing edge surface 2a and an upper pole piece $1d_2$ provided above the lower pole piece $1d_1$, wherein the foregoing coil pattern 1a is formed in a space defined between the upper pole piece $1d_2$ and the lower pole piece $1d_1$. The upper and lower pole pieces $1d_1$ and $1d_2$ are connected with each other at respective rear ends to form a closed magnetic circuit that passes through the magnetic gap 1g. It should be noted that the magnetic gap 1g is formed between respective front ends of the upper and lower pole pieces $1d_1$ and $1d_2$.

FIG. 1D shows the details of the magnetic gap 1g in an enlarged scale. Referring to FIG. 1D, it will be noted that the pole pieces $1d_1$ and $1d_2$ come closer with each other at respective front ends thereof to form a gap having a minute gap width of 1 µm or less.

In such a conventional magnetic head, the maximum recording density that the magnetic head can attend to, in other words the resolution of the magnetic head, is determined by the gap width of the magnetic head and the distance from the magnetic head to a magnetic recording medium. In the conventional magnetic head that uses a coil wound around a magnetic core, a recording density of about 65 Mbits/inch$^2$ is already achieved by using a gap of 1 µm. However, it is expected that, in future, a super-high-density magnetic head that can successfully perform reading and writing with a recording density exceeding 20 Gbits/inch$^2$, becomes necessary.

In order to realize such a super-high-resolution resolution magnetic head, it is necessary to provide a magnetic sensor having a super-high-sensitivity that can pick up an extremely feeble magnetic signal. It should be noted that, in the recording density of 20 Gbits/inch$^2$, each bit of the information signal forms a magnetization spot on a magnetic recording medium with a size of about 45 nm×750 nm. Thus, the magnetic head for such a super-high-density recording should have a gap width close to 45 nm. As long as a conventional electro-magnetic conversion device is used, the magnetic head cannot detect such an extremely minute magnetization spot at high speed. In other words, the conventional magnetic head cannot provide necessary sensitivity and response.

As a super-high-sensitivity magnetic head capable of detecting such an extremely small recording dot, it is proposed to use a magnetic head that is equipped with a magnetoresistive sensor. See, for example, P. Ciureanu and H. Gavrilä, Studies in Electrical and Electronic Engineering 39, "Magnetic Heads for Digital Recording," Chapter 7, Elsevier Publication, 1990.

In such a magnetic head equipped with a magnetoresistive sensor, detection of a recording dot is made by detecting a change in the resistance of a ferromagnetic film, typically a film of a polycrystalline Fe—Ni alloy. It should be noted that such a polycrystalline ferromagnetic film shows a uniaxial magnetic anisotropy defined by an easy axis of magnetization and a hard axis of magnetization, and changes the direction of magnetization with respect to the foregoing two magnetic axes, in each of magnetic domains formed in the film, in response to an external magnetic field. As the resistance of the ferromagnetic film changes in response to the direction of magnetization with respect to the magnetic axes, it is possible to detect the external magnetic field, and hence the magnetic recording bit, by measuring the resistance of the ferromagnetic film. It should be noted that the resistance of the ferromagnetic film becomes maximum when the direction of magnetization is parallel to the easy axis of magnetization and becomes minimum when the direction of magnetization is perpendicular to the easy axis of magnetization.

Meanwhile, it is preferable, in a general magnetic head including also the super-high-sensitivity magnetic head, to carry out reading and writing by using the same, single magnetic gap for avoiding off-track loss. Thus, it is more preferable to construct a single gap head that includes only one magnetic gap as compared with a double gap head that includes two magnetic gaps one for recording and one for reading.

In this respect, the magnetoresistive sensor using the ferromagnetic film is advantageous for constructing a reading head inside a writing head because of the reduced size of the sensor. On the other hand, such a construction of providing a magnetoresistive sensor inside the gap of the magnetic writing head causes a problem in that the strong magnetic field formed in the magnetic gap at the time of writing may induce a rearrangement in the magnetic domains in the ferromagnetic film. It should be noted that the magnetic field inside the magnetic gap can exceed 2000 Gauss. Thereby, the magnetoresistive characteristics of the ferromagnetic film may be changed as a result of the writing, and the reading by using such a magnetoresistive sensor becomes inevitably unstable.

As a magnetic sensor immune to the magnetic field acting at the time of writing, it is proposed to use a semiconductor magnetic sensor that utilizes the Hall effect, for the magnetic head. In such a semiconductor magnetic sensor, a two-dimensional electron gas is formed at a heterojunction interface of semiconductor layers forming a modulation doped structure, and the detection of the magnetic field is achieved by detecting the Hall effect induced in such a two-dimensional electron gas. As the two-dimensional electron gas exhibits an extremely large electron mobility, the semiconductor magnetic sensor shows a correspondingly high sensitivity of magnetic detection.

FIG. 2A shows an example of such a Hall-effect semiconductor magnetic sensor while FIG. 2B shows a part of the magnetic sensor in detail.

Referring to FIGS. 2A and 2B, the semiconductor magnetic sensor is constructed upon a semiconductor layered body 21 to be described later in detail with reference to FIG. 3, and includes electrodes 22A and 22B disposed on the upper major surface of the layered body 21 in alignment in a first direction to form a first electrode pair, and electrodes 22C and 22D disposed on the upper major surface of the layered body 21 in alignment in a second direction perpendicular to the first direction, to form a second electrode pair. In the illustrated example, the electrode 22A acts as a source electrode and injects electrons into the semiconductor layered body 21, while the electrode 22B acts as a drain electrode and collects the electrons injected by the electrode 22A and passed through the semiconductor layered body 21. Further, the Hall-effect is detected by measuring the Hall-voltage appearing across the electrodes 22C and 22D.

It should be noted that the semiconductor layered body 21 has a modulation doped structure similar to that used in a HEMT, and includes an undoped active layer $21_{-1}$ formed on a semi-insulating substrate, an n-type electron supplying layer $21_{-3}$ provided on the active layer $21_{-1}$, with a thin spacer layer $21_{-2}$ intervening between the active layer $21_{-1}$ and the electron supplying layer $21_{-3}$, for supplying electrons into the active layer $21_{-1}$, and an n-type contact layer $21_{-4}$ formed on the electron supplying layer $21_{-3}$, wherein the foregoing electrodes 22A–22D are formed on the upper major surface of the contact layer $21_{-4}$. Similar to ordinary HEMTs, a two-dimensional electron gas (2DEG) is formed in the active layer $21_{-1}$ along a heterojunction interface to the spacer layer $21_{-2}$.

FIG. 3 shows the modulation doped structure of the semiconductor layered body 21 in more detail.

Referring to FIG. 3, the semiconductor layered body 21 is formed on a semi-insulating GaAs substrate 210, and includes an undoped buffer layer 211 of GaAs formed on the substrate 210 with a thickness of about 500 nm, wherein the buffer layer 211 carries thereon a first superlattice structure formed of an alternate stacking of an undoped AlAs layer 212 having a thickness of 1.5 nm and an undoped GaAs layer 213 having a thickness of 2.5 nm. It should be noted that the first superlattice structure includes the layers 212 and 213 repeated $\underline{n}$ times, and corresponds to the active layer $21_{-1}$ of FIG. 2B.

On the first superlattice structure, there is provided a second superlattice structure comprising a stacking of an undoped layer 214 of AlAs having a thickness of 1.5 nm, an undoped layer 215 of GaAs having a thickness of 0.5 nm, an n-type layer 216 of GaAs having a thickness of 1.5 nm, and an undoped layer 217 of GaAs having a thickness of 0.5 nm, wherein the layer 214 contacts with the uppermost layer of the first superlattice structure at the lowermost part of the second superlattice structure as a layer corresponding to the spacer layer $21_{-2}$. Further, the foregoing layers 214–217 are repeated $\underline{m}$ times to form the second superlattice structure, wherein the second superlattice structure corresponds to the electron supplying layer $21_{-3}$ of FIG. 2B. Further, an n-type layer 218 of GaAs is provided on the second superlattice structure with a thickness of 10 nm in correspondence to the contact layer $21_{-4}$ of FIG. 2B. It should be noted that the layer 218 carries thereon the foregoing electrodes 22A–22D.

In such a modulation doped structure, it should be noted that the electrons supplied from the n-type GaAs layer 216 in the second superlattice structure form a two-dimensional gas (2DEG) in the undoped GaAs layer 211 along the interface to the spacer layer 212, and the two-dimensional electron gas thus formed causes a Hall-effect upon application of an external magnetic field as already noted. By employing the superlattice structure, it is possible to increase the electron density of the two-dimensional electron gas.

Generally, a Hall-effect magnetic sensor provides a Hall voltage $V_H$ such that the Hall voltage is proportional to the mobility $\mu$ of the carrier in a conductive layer to which the magnetic field is applied and is inversely proportional to the thickness d of the conductive layer ($V_H \propto \mu/d$), wherein the conductive layer is provided, in the case of the foregoing semiconductor structure, by the two-dimensional electron gas. As the electron mobility $\mu$ in such a two-dimensional electron gas is enormous, and as the thickness $\underline{d}$ of the two-dimensional electron gas is minimum, the semiconductor magnetic sensor that uses such a two-dimensional electron gas provides a very large sensitivity.

When using such a Hall-effect magnetic sensor in a thin-film magnetic head as shown in FIGS. 1A–1D, it is necessary and desirable to accommodate the magnetic sensor in the gap 1g formed at the tip end of the magnetic yoke. For this to be achieved, it is necessary to reduce the overall thickness of the Hall-effect magnetic sensor. This is particularly important in the super-high-sensitivity magnetic head used for super-high-density recording. In the Hall-effect magnetic sensor that uses the normal modulation doped-structure shown in FIG. 3, the semiconductor layered body formed on the buffer layer 211 generally has a thickness of about 500 nm, while the buffer layer 211 itself has a thickness of about 500 nm. This means that, even if the semi-insulating substrate 210 is removed entirely, the total thickness of the magnetic sensor still exceeds 1000 nm.

FIG. 4 shows the scanning of a recording mark A by means of a thin-film magnetic head having a gap width of 500 nm, along a recording track of which width is set to 750 nm. In such a case, the recording density achieved on the recording medium is about 1 Gbits/inch². It should be noted that the area of the recording mark A is $3.75 \times 10^{-9}$ cm², while this value corresponds to the recording density of $\frac{1}{5.8} \times 10^{-10}$ bits/inch². The latter is approximately equal to the recording density of 1 Gbits/inch².

The evaluation of FIG. 4 indicates that, in order to achieve a recording density reaching the expected value of 20 Gbits/inch², it is necessary to reduce the gap width of the thin film magnetic head to be about 50 nm or less. For this purpose, it is necessary to reduce the thickness of the Hall-effect magnetic sensor to be approximately 50 nm or less.

FIG. 5 shows a diagram explaining the problem that arises when the thickness $\underline{d}$ of the semiconductor layered body formed on the substrate 210 of. FIG. 3 is reduced. In FIG. 5, the semiconductor layers 212–218 formed on the active layer 211 are collectively designated by a reference numeral 221. Further, the total thickness of the semiconductor layered body 221 thus defined is designated by $\underline{S}$.

Referring to FIG. 5, it will be noted that there is formed a surface depletion region indicated by hatching in such a semiconductor structure, such that the surface depletion region extends from the surface of the semiconductor layered body 221 toward the substrate 210. Thus, when the thickness S of the semiconductor layered body 221 is reduced, the surface depletion region inevitably comes closer to the two-dimensional electron gas (2DEG) formed in the active layer 211. With a further reduction in the thickness S, the surface depletion region ultimately reaches the two-dimensional electron gas itself.

When the surface depletion region penetrates deeply into the semiconductor layered body 221 that includes the electron supplying layer 216 or reaches the two-dimensional electron gas itself, the two-dimensional gas, which is essential for the operation of the Hall-effect sensor, vanishes. Thereby, the Hall-effect no longer occurs and the device does not operate as a Hall-effect magnetic sensor. A similar problem occurs also when the substrate 210 is removed and the thickness of the layer 211 is reduced.

Thus, it will be noted that, while the Hall-effect magnetic sensor having a conventional modulation doped structure may have an advantageous feature of extremely high sensitivity and extremely high resolution, there is a serious problem in that the two-dimensional electron gas vanishes when the thickness of the device is reduced so as to enable accommodation of the Hall-effect semiconductor magnetic sensor in a magnetic gap of a high resolution thin-film magnetic head.

SUMMARY OF THE INVENTION

Accordingly, it is a general object of the present invention to provide a novel and useful Hall-effect magnetic sensor and a thin-film magnetic head that uses such a Hall-effect magnetic sensor, wherein the foregoing problem is eliminated.

Another and more specific object of the present invention is to provide a Hall-effect magnetic sensor suitable for use in a magnetic gap of a super-high-resolution high-resolution magnetic head.

Another object of the present invention is to provide a Hall-effect magnetic sensor having a modulation doped structure, wherein the thickness of the device can be reduced successfully without causing a vanishing of the two-dimensional electron gas.

Another object of the present invention is to provide a super-high-resolution magnetic sensor that uses such a Hall-effect magnetic sensor having a modulation doped structure, in a magnetic gap of the head.

Another object of the present invention is to provide a Hall-effect magnetic sensor, comprising:

a first barrier layer of an undoped semiconductor material defined by first and second, mutually opposing principal surfaces and having a first bandgap;

a quantum well layer provided on said second principal surface of said first barrier layer, said quantum well layer being defined by first and second, mutually opposing principal surfaces and formed of an undoped semiconductor material having a second bandgap substantially smaller than said first bandgap;

a second barrier layer of an undoped semiconductor material defined by first and second, mutually opposing principal surfaces and having a third bandgap substantially larger than said second bandgap;

at least one of said first and second barrier layers including a delta-doped layer of a dopant having a thickness of several atomic layers or less;

a source electrode provided on said quantum well layer in ohmic contact therewith, said source electrode injecting carriers into said quantum well layer;

a drain electrode provided on said quantum well layer in ohmic contact therewith, said drain electrode recovering carriers from said quantum well layer;

a first Hall electrode provided on said first principal surface of said first barrier layer; and a second Hall electrode provided on said second principal surface of said second barrier layer;

said first and second Hall electrodes detecting a Hall voltage appearing in said quantum well layer.

According to the present invention, the surface depletion layer extending from the surface of the semiconductor layered body is shielded effectively by the delta-doped layer formed in one or both of the first and second barrier layers and does not reach the quantum well layer. Thereby, the problem of the carriers vanishing in the quantum well layer is effectively eliminated. It should be noted that the delta-doped layer acts to pull down the energy level of the conduction band in the barrier layer. Thereby, even when the energy level of the first or second barrier layer has been raised as a result of the effect of the surface depletion layer, the level of the conduction band of the quantum well layer is maintained below the Fermi level. In other words, the Hall-effect magnetic sensor operates properly even when the thickness of the device is reduced to an extent that the carriers in the quantum well layer would otherwise be vanished.

Another object of the present invention is to provide a thin-film magnetic head, comprising:

a substrate;

a lower pole piece provided on said substrate, said lower pole piece having first and second ends;

an upper pole piece provided on said lower yoke with a separation from said lower pole piece by a space formed between said upper and lower pole pieces, said upper pole piece having third and fourth ends respectively corresponding to said first and second ends, said upper pole piece being connected, at said fourth end, to said second end of said lower pole piece;

said upper and lower pole pieces defining a magnetic gap between said first and second ends;

magnetic energization means provided in said space between said lower pole piece and said upper pole piece, for creating a magnetic flux, in response to a recording signal, along a magnetic circuit that passes through said first and second pole pieces including said magnetic gap; and a Hall-effect magnetic sensor provided between said upper and lower pole pieces, said Hall-effect magnetic sensor comprising:

a first barrier layer of an undoped semiconductor material defined by first and second, mutually opposing principal surfaces and having a first bandgap;

a quantum well layer provided on said second principal surface of said first barrier layer, said quantum well layer being defined by first and second, mutually opposing principal surfaces and formed of an undoped semiconductor material having a second bandgap substantially smaller than said first bandgap;

a second barrier layer of an undoped semiconductor material defined by first and second, mutually opposing principal surfaces and having a third bandgap substantially larger than said second bandgap;

at least one of said first and second barrier layers including a delta-doped layer of a dopant having a thickness of several atomic layers or less;

a source electrode provided on said quantum well layer in ohmic contact therewith, said source electrode injecting carriers into said quantum well layer;

a drain electrode provided on said quantum well layer in ohmic contact therewith, said drain electrode recovering carriers from said quantum well layer;

a first Hall electrode provided on said first principal surface of said first barrier layer; and a second Hall electrode provided on said second principal surface of said second barrier layer;

said first and second Hall electrodes detecting a Hall voltage appearing in said quantum well layer.

According to the present invention, it is possible to provide a super-high-resolution magnetic head that is capable of detecting a recording mark formed on a recording medium with a recording density of 20 Gbits/inch$^2$ or more. It should be noted that the Hall-effect magnetic sensor used in the present invention can be configured to have a total thickness of 50 nm or less and is successfully accommodated in the magnetic gap of which width is set to be 50 nm or less for super-high-density recording. As such a Hall-effect magnetic sensor uses a two-dimensional carrier gas formed in the quantum well layer, a very large sensitivity is achieved in view of the very large carrier mobility in two-dimensional carrier gas formed in the undoped quantum well layer and the very small thickness of the two-dimensional carrier gas.

Another object of the present invention is to provide a method for fabricating a Hall-effect magnetic sensor, comprising the steps of:

growing a first barrier layer of a semiconductor material having a first bandgap by supplying, on a substrate, a first gaseous source containing a first element and a second gaseous source containing a second element belonging to a group different from a group of said first element in the periodic table;

said step of growing the first barrier layer including the steps of:

interrupting a supplying of one of said first and second gaseous sources and commencing a supplying of a dopant source that contains a dopant to form a delta-doped layer;

interrupting the supplying of said dopant source and resuming the supplying of said gaseous source that has been interrupted, such that the growing of said first barrier layer is resumed;

growing a quantum well layer of a semiconductor material having a second bandgap smaller than said first bandgap, on said first barrier layer, by supplying a third gaseous source containing a third element and a fourth gaseous source containing a fourth element belonging to a group different from a group of said third element in the periodic table;

growing a second barrier layer of a semiconductor material having a third bandgap larger than said second bandgap by supplying, on said quantum well layer, a fifth gaseous source containing a fifth element and a sixth gaseous source containing a sixth element belonging to a group different from a group of said sixth element in the periodic table;

said step of growing the second barrier layer including the steps of:

interrupting a supplying of one of said fifth and sixth gaseous sources and commencing a supplying of a dopant source that contains a dopant to form a delta-doped layer;

interrupting the supplying of said dopant source and resuming the supplying of said gaseous source that has been interrupted, such that the growing of said second barrier layer is resumed; and removing said substrate by a selective etching process.

According to the present invention, it is possible to form a very thin dopant layer in the first and second barrier layers. Thereby, the energy level of the barrier layers and hence the Fermi level in the quantum well layer can be controlled by using the delta-doped layer such that no carrier depletion occurs in the quantum well layer even when the total thickness of the semiconductor layered structure forming the Hall-effect magnetic sensor is reduced and the surface depletion region reaches the quantum well layer. In other words, the thin delta-doped layer acts to shield the quantum well layer from the surface depletion region. It should be noted that there occurs no substantial growth of the first or second barrier layer when forming the delta-doped layer, as the supply of one of the gaseous sources is interrupted. Because of the fact that the delta-doped layer is extremely thin, the flow of the carriers injected to and traveling through the first or second barrier layer to or from the quantum well layer, is not adversely affected.

Other objects and further features of the present invention will become apparent from the following detailed description when read in conjunction with the attached drawings.

BRIEF DESCRIPTION OF THE DRAWINGS

FIGS. 1A–1D are diagrams showing various parts of a conventional thin-film magnetic head;

FIGS. 2A and 2B are diagrams showing the construction of a conventional Hall-effect magnetic sensor that uses a two-dimensional electron gas;

FIG. 4 is a diagram showing an example of a recording mark formed on a magnetic recording medium in a super-high-density recording;

DETAILED DESCRIPTION OF THE PREFERRED EMBODIMENTS

Figure 3:
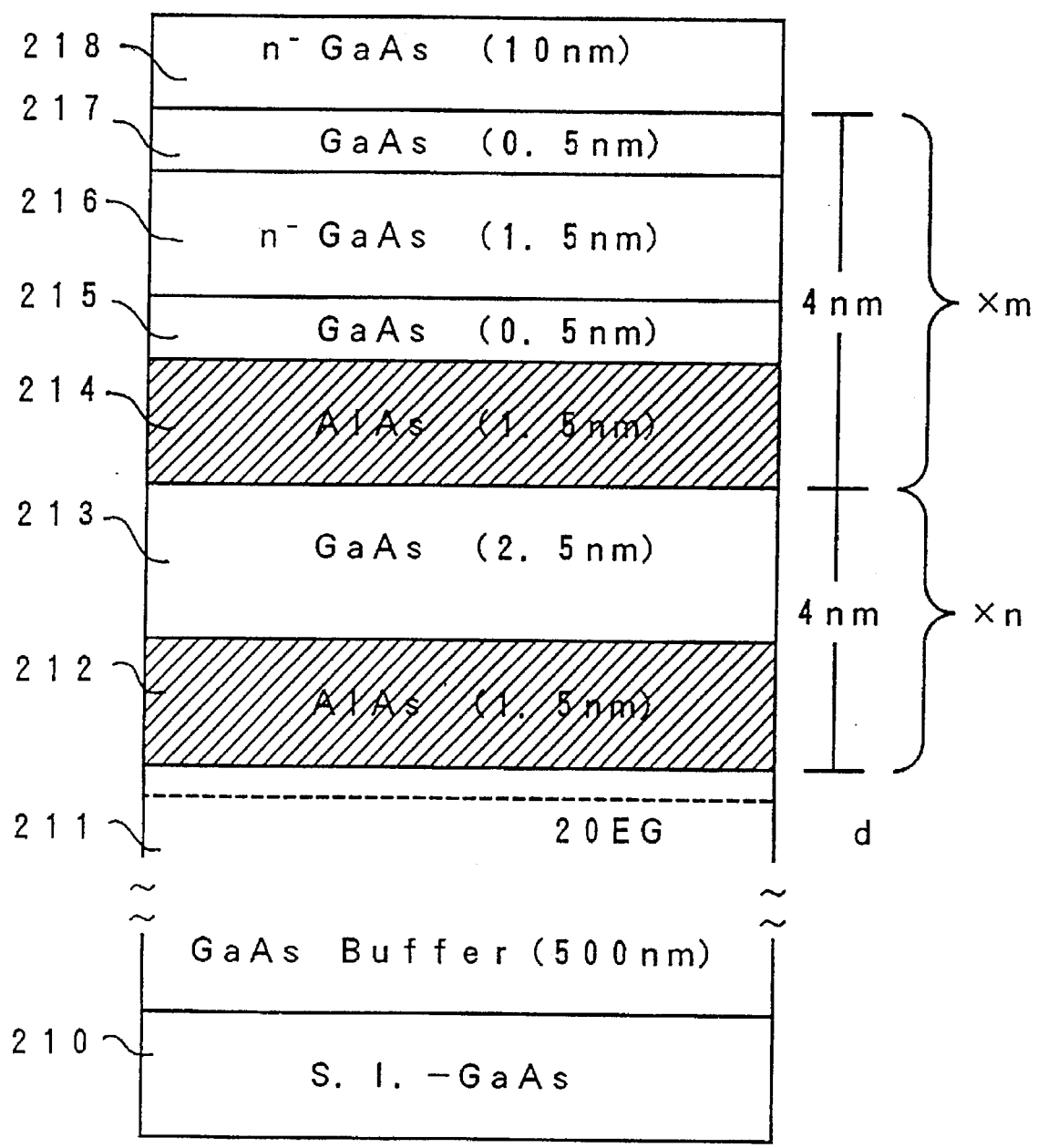
FIG. 3 is a diagram showing the structure of a semiconductor layered body used in the conventional Hall-effect magnetic sensor shown in FIGS. 2A and 2B.
Figure 5:
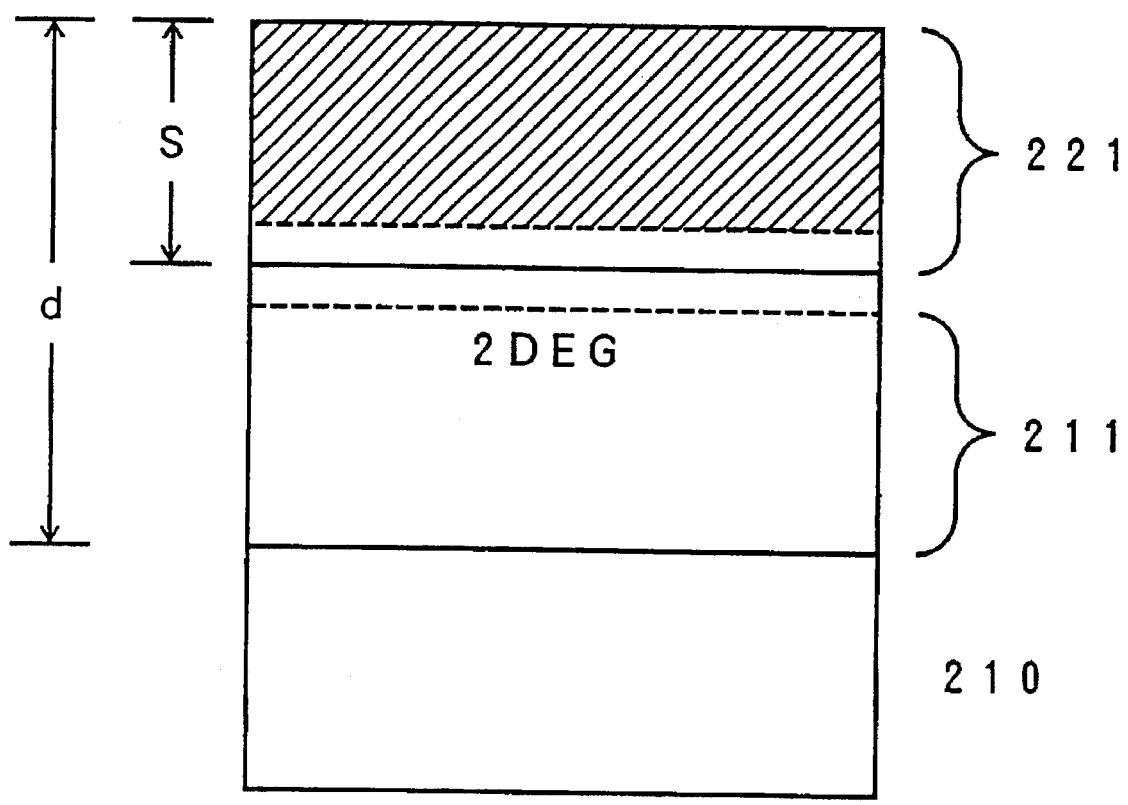
FIG. 5 is a diagram explaining the problem addressed by the present invention.
Figure 6:
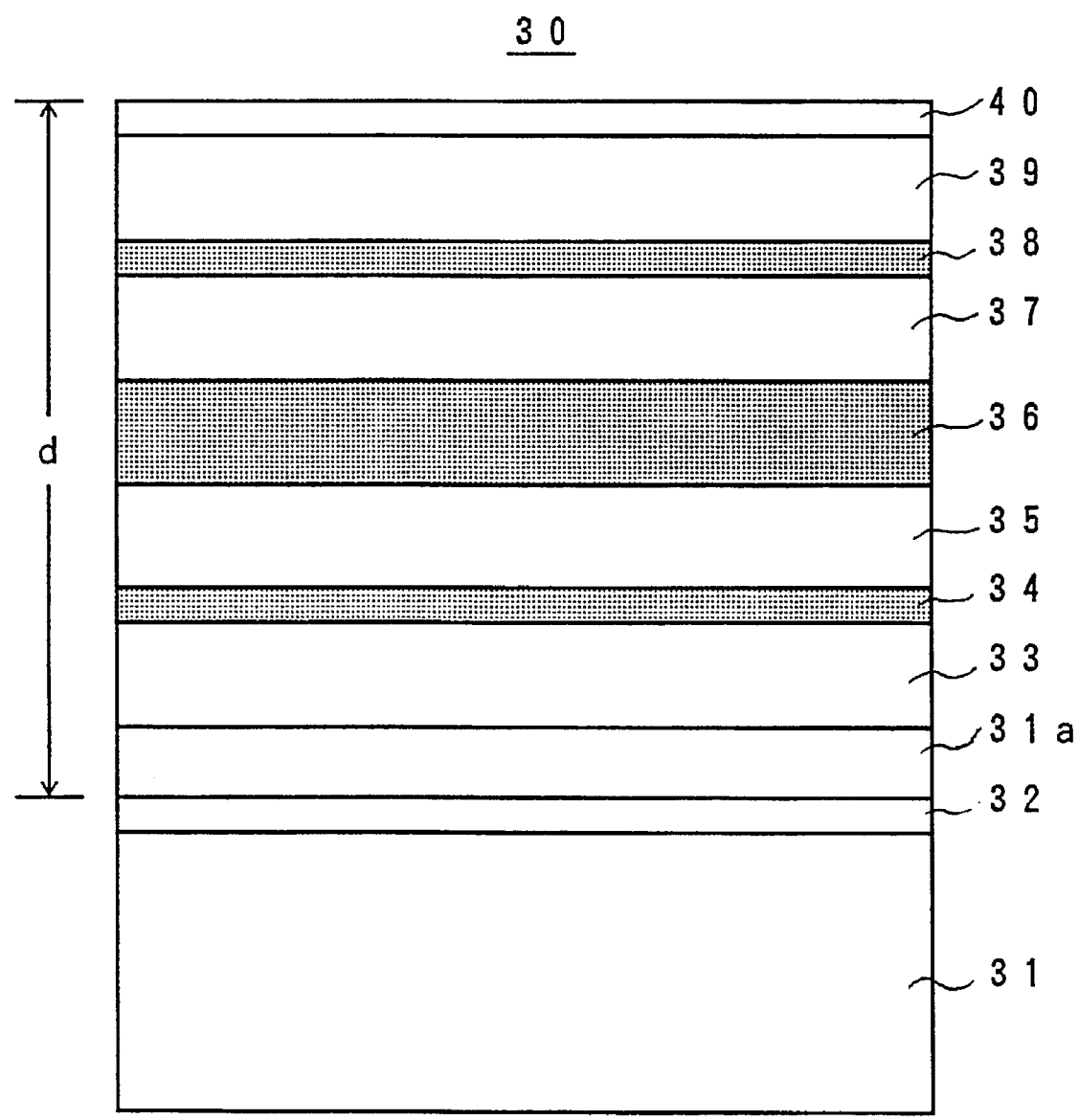
FIG. 6 is a diagram showing the construction of a semiconductor layered body used in a Hall-effect semiconductor device according to a first embodiment of the present invention.

FIG. 6 shows a Hall-effect magnetic sensor 30 according to a first embodiment of the present invention.

Referring to FIG. 6, the Hall-effect magnetic sensor is formed on a semi-insulating substrate 31 of GaAs that carries thereon an etching stopper layer 32 of AlAs. The magnetic sensor includes an undoped buffer layer 31a of GaAs formed on the etching stopper layer 32 with a thickness of 10 nm. On the buffer layer 31a, there is provided an undoped barrier layer 33 of AlGaAs with a thickness of 20 nm, wherein the barrier layer 33 carries thereon a delta-doped layer 34 of Si in which Si atoms are deposited with a thickness of only several atomic layers. On the delta-doped layer 34, an undoped barrier layer 35 of AlGaAs is formed with a thickness of 10 nm. It should be noted that any of the AlGaAs layers 33 and 35 has a composition of $Al_{0.3}Ga_{0.7}As$ and is formed by an ordinary MBE or MOCVD process that supplies the constituent elements in the form of gaseous source. On the other hand, the delta-doped layer 34 has a sheet density of Si of $1.3 \times 10^{12}$ cm$^{-2}$ and is formed by supplying a dopant gas of Si in the state that the growth of the AlGaAs layer 33 is interrupted as will be described later.

In the delta-doping process, for example, the supply of the gaseous source of As such as arsine is interrupted and Si is supplied in the form of silane. As the supply of As is interrupted, no growth of AlGaAs occurs and only a layer of is Si is deposited, but only with a few atomic layer thickness. This process of delta-doping is interrupted immediately, and the growth of AlGaAs is resumed by interrupting the supply of Si and resuming the supply of the gaseous source of As. Of course, one may interrupt the supply of the gaseous sources of Al and Ga such as TMA (trimethylaluminum) and TMG (trimethylgallium) when conducting the delta-doping process.

On the barrier layer 35, there is formed a quantum well layer 36 of undoped GaAs with a thickness of 10 nm, and a barrier layer 37 of undoped AlGaAs is formed on the quantum well layer 36 with a thickness of 10 nm. Similarly to the layer 33, the barrier layer 37 carries thereon a delta-doped layer 38 of Si corresponding to the delta-doped layer 34, with a thickness of several atomic layers, and another barrier layer 39 of AlGaAs is formed on the delta-doped layer 38 with a thickness of 20 nm. The AlGaAs layer 39 further carries thereon a cap layer 40 of undoped GaAs with a thickness of 1 nm. It should be noted that the AlGaAs layers 37 and 39 have a composition of $Al_{0.3}Ga_{0.7}As$.

In the semiconductor layered body 30 having such a structure, it should be noted that the barrier layers 33 and 35 as well as the barrier layers 37 and 39, each formed of AlGaAs and having a bandgap substantially larger than that of GaAs, cause a quantum confinement of carriers in the quantum well layer 36. In other words, there appear quantum levels in the quantum well layer 36 because of the extremely reduced thickness of the layer 36. In such a structure, the thickness for the essential part of the layered structure, extending from the layer 33 to the layer 39 and are essential for the operation of the Hall-effect magnetic sensor, is held within 70 nm. After the layered structure of FIG. 6 is completed, the substrate 31 is removed by a selective etching process that stops spontaneously at the etching stopper layer 32.

Figure 7:
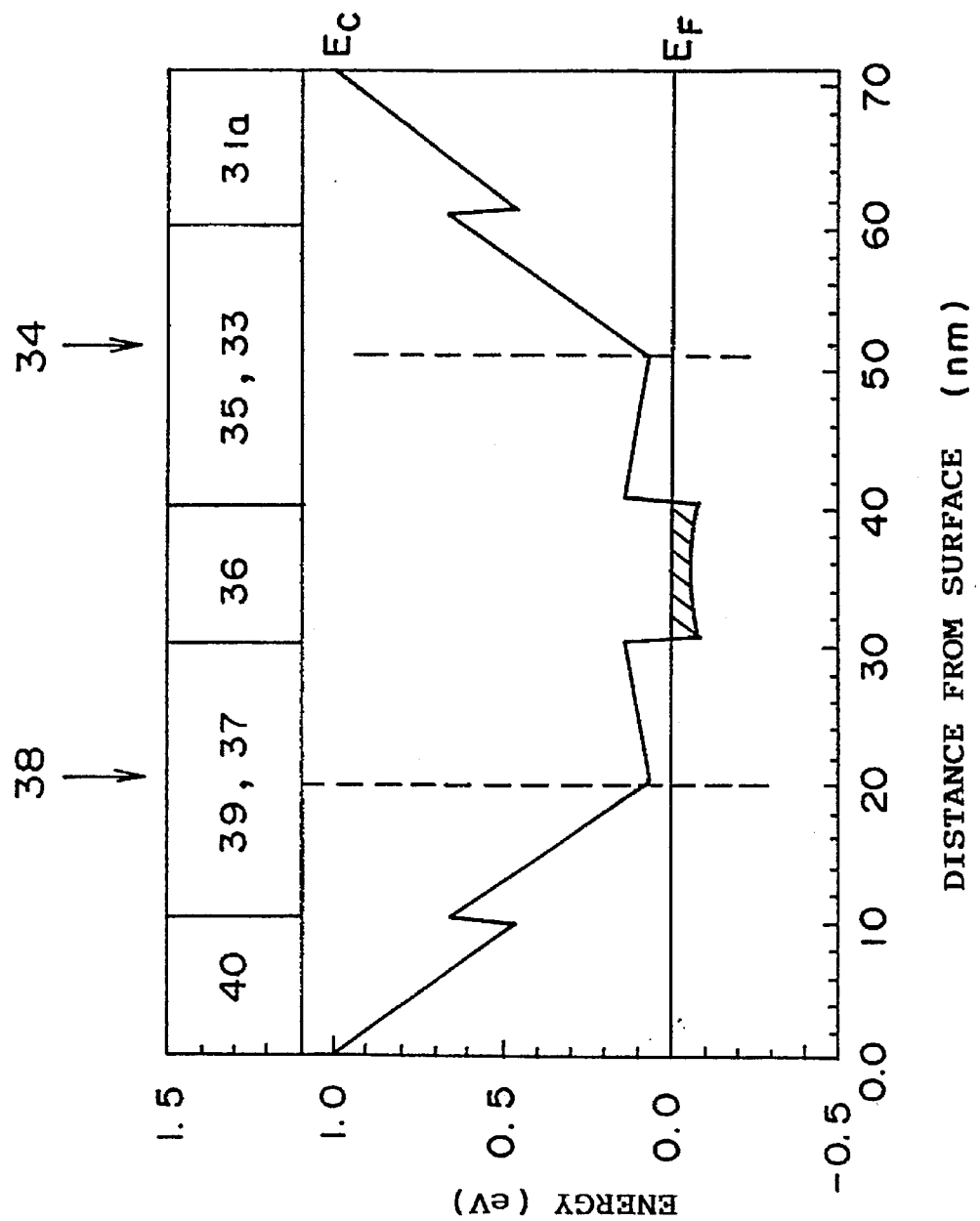
FIG. 7 is a diagram showing the band structure of the semiconductor layered body of FIG. 6.

FIG. 7 shows the band structure of the semiconductor layered body 30 of FIG. 6 for the state in which the substrate 31 is removed, wherein $E_F$ in FIG. 7 represents the Fermi level while Ec represents the conduction band. Further, the horizontal axis indicates the distance measured from the surface of the layer 40.

Referring to FIG. 7, it should be noted that, while the difference in the lower edge level of the conduction band Ec between GaAs that forms the quantum well layer 36 and AlGaAs that forms the barrier layers 33 and 35 or 37 and 39, is in the order of 0.2 eV in the ordinary thermal equilibrium state of GaAs and AlGaAs crystals, it will be noted in FIG. 7 that the lower edge of the conduction band Ec is located at a level much higher than the Fermi level $E_F$ and hence the conduction band Ec of the quantum well layer 36, for the barrier layer 39 or 40 that is located above the delta-doped layer 38 or for barrier the layer 33 or 31a located below the delta-doped layer 34. Such a rise of the conduction band Ec clearly indicates the effect of the surface depletion region that penetrates to such barrier layers. In such a state, the lower edge level of the conduction band Ec of the quantum well layer 36 as well as the corresponding lower edge level of the barrier layers 35 and 37 that are located adjacent to the quantum well layer 36, would exceed the Fermi level $E_F$, unless the foregoing delta-doped layer 34 or 38 is provided. When the level of the quantum well layer 36 exceeds the Fermi level $E_F$, no accumulation of electrons occurs in the quantum well layer 36 anymore. In other words, the quantum well layer 36 is depleted with carriers and the device no longer shows the Hall-effect.

In the semiconductor layered body 30 of FIG. 6, such an adverse effect of the surface depletion region is successfully shielded by providing the delta-doped layers 34 and 38 with a high sheet density of dopant, such that the lower edge level of the conduction band Ec of the quantum well layer 36, and hence the quantum levels therein, are successfully pinned at an energy level below the Fermi level $E_F$. Thereby, existence of the carriers, more specifically the existence of electrons in the quantum well layer 36, is guaranteed even when the thickness of the semiconductor layered body 30 is reduced. The electrons thus confined in the quantum well layer 36 form a two-dimensional electron gas because of the extremely reduced thickness of the quantum well layer 36.

Figure 8:
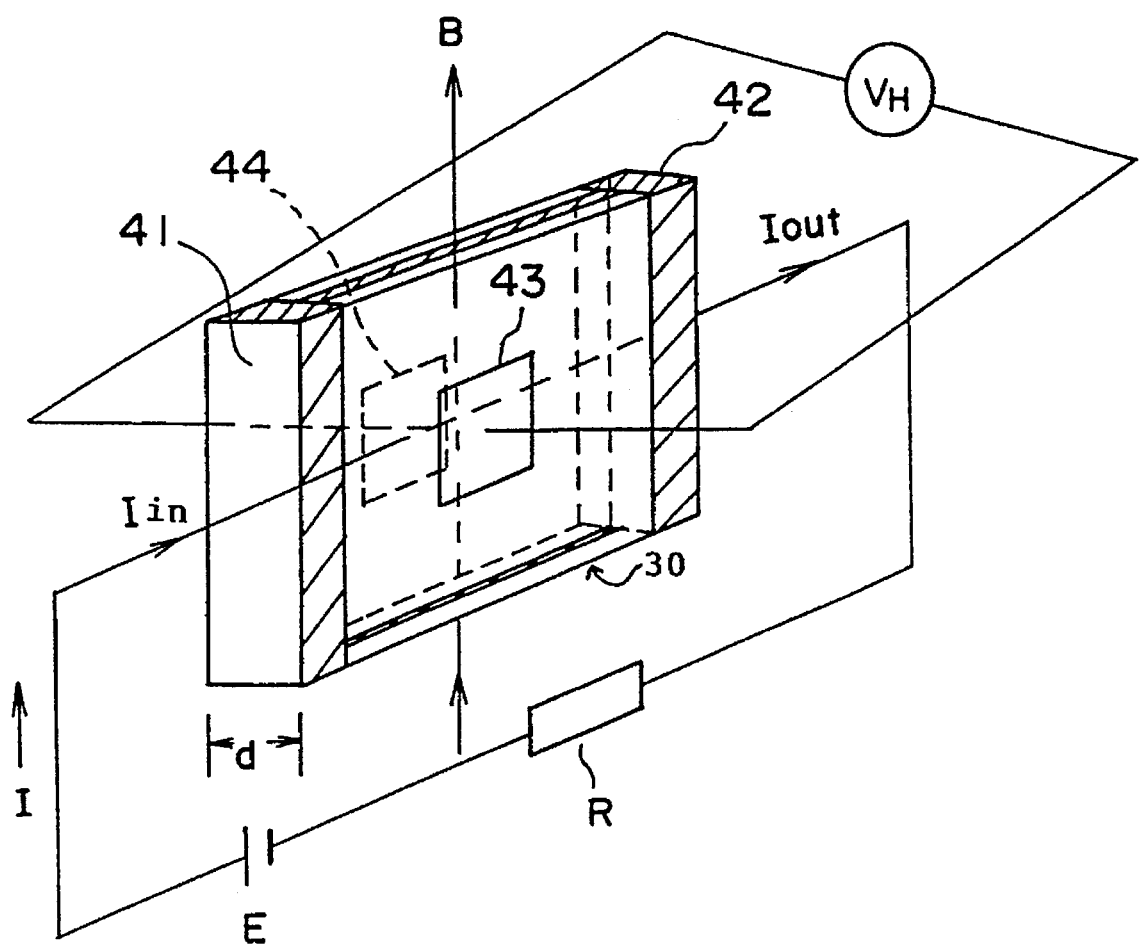
FIG. 8 is a diagram showing the overall construction of the Hall-effect magnetic sensor of the present invention.

FIG. 8 shows the construction of a magnetic sensor that uses the semiconductor layered body 30 of FIG. 6.

Referring to FIG. 8, the magnetic sensor includes ohmic electrodes 41 and 42 formed at two, mutually opposing edges of the semiconductor layered body 30 for injecting a current I from a power supply, which may include a d.c. voltage source and a resistor R. In response to the injection of the current I, carriers are caused to flow through the quantum well layer 36 in the semiconductor layered body 30, and the carriers thus injected experience the Hall-effect in response to a magnetic field B acting parallel to the quantum well layer 36 as they travel through the layer 36 from the electrode 42 to the electrode 41.

As a result of the Hall-effect, there appears a Hall voltage $V_H$ between the electrodes 43 and 44 that are provided on the upper and lower major surfaces of the semiconductor layered body 30. In such a Hall-effect magnetic sensor that uses a two-dimensional electron gas, one obtains a large Hall voltage $V_H$ because of the large mobility of electrons in the two-dimensional electron gas and a very small thickness of the quantum well layer 36. In other words, the Hall-effect magnetic sensor of FIG. 8 provides a superior sensitivity.

Figure 9:
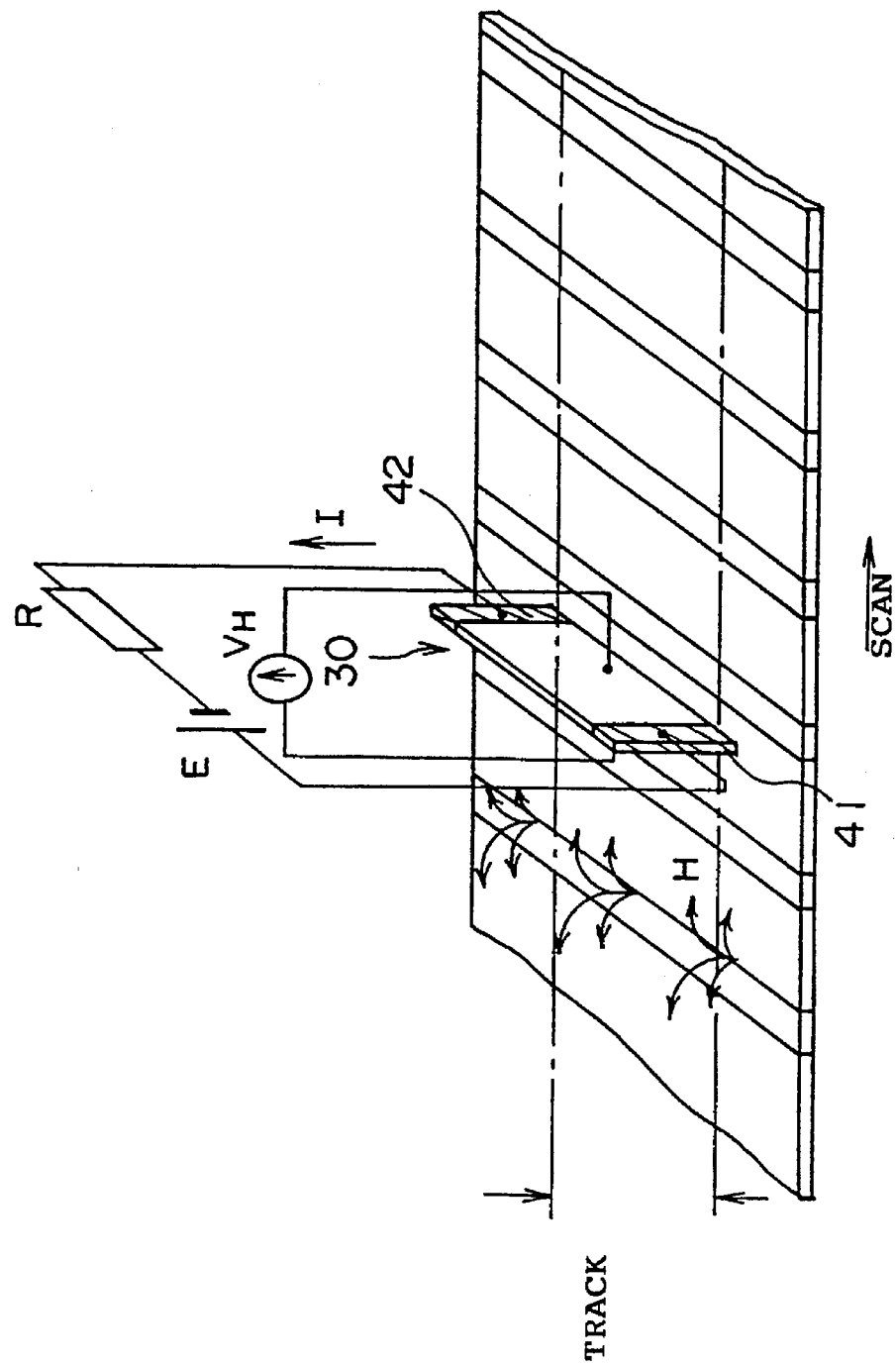
FIG. 9 is a diagram showing the use of the Hall-effect magnetic sensor for reading information from a magnetic recording medium.

FIG. 9 shows the reading of information from a magnetic recording medium by means of such a Hall-effect magnetic sensor.

Referring to FIG. 9, the magnetic sensor 4 is held upright with respect to a recording surface of the recording medium and is moved, with respect to the recording medium, to scan over the recording surface along a predetermined track. As a result of the scanning, the magnetic sensor detects a magnetic field B that corresponds to the information recorded on the magnetic recording medium in the form of magnetization H.

Figure 10:
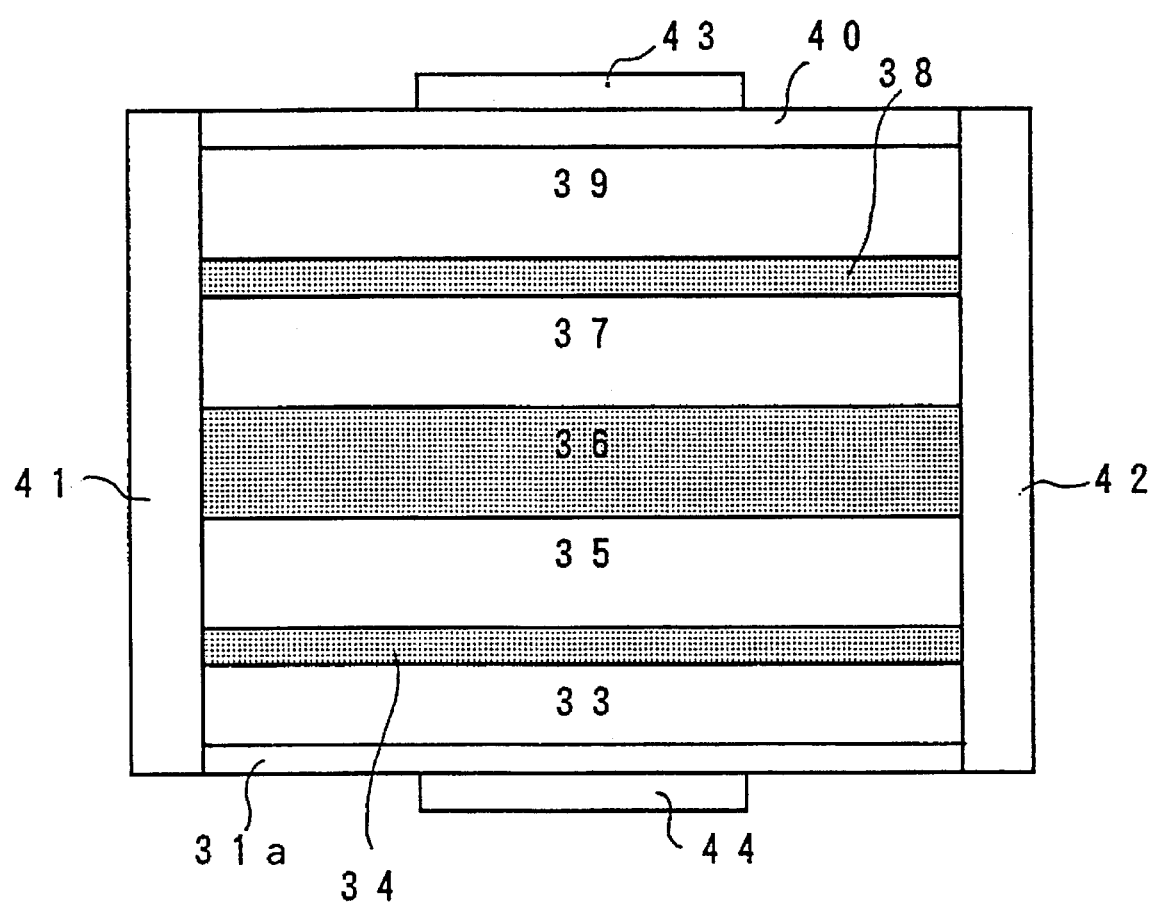
FIG. 10 is a diagram showing the structure of the Hall-effect magnetic sensor according to the first embodiment of the present invention.

FIG. 10 shows the construction of the Hall-effect magnetic sensor shown in FIGS. 8 and 9.

Referring to FIG. 10, the magnetic sensor is formed of the semiconductor layered body 30 from which the substrate 31 is removed by a selective etching process as already noted, and includes the ohmic electrodes 41 and 42 provided at both lateral edges of the layered semiconductor body 30 for injecting and collecting electrons to and from the quantum well layer 36, wherein the ohmic electrodes 41 and 42 are formed typically of a stacking of Au and an Au—Ge alloy. Further, FIG. 10 shows the electrodes 43 and 44 as being provided respectively on the upper major surface of the undoped GaAs layer 40 and on the lower major surface of the undoped GaAs layer 31a, wherein the electrodes 43 and 44 are formed of an Au—Ge alloy.

Next, a thin-film magnetic head that uses the Hall-effect magnetic sensor of FIG. 10 will be described with reference to FIG. 11.

Figure 11:
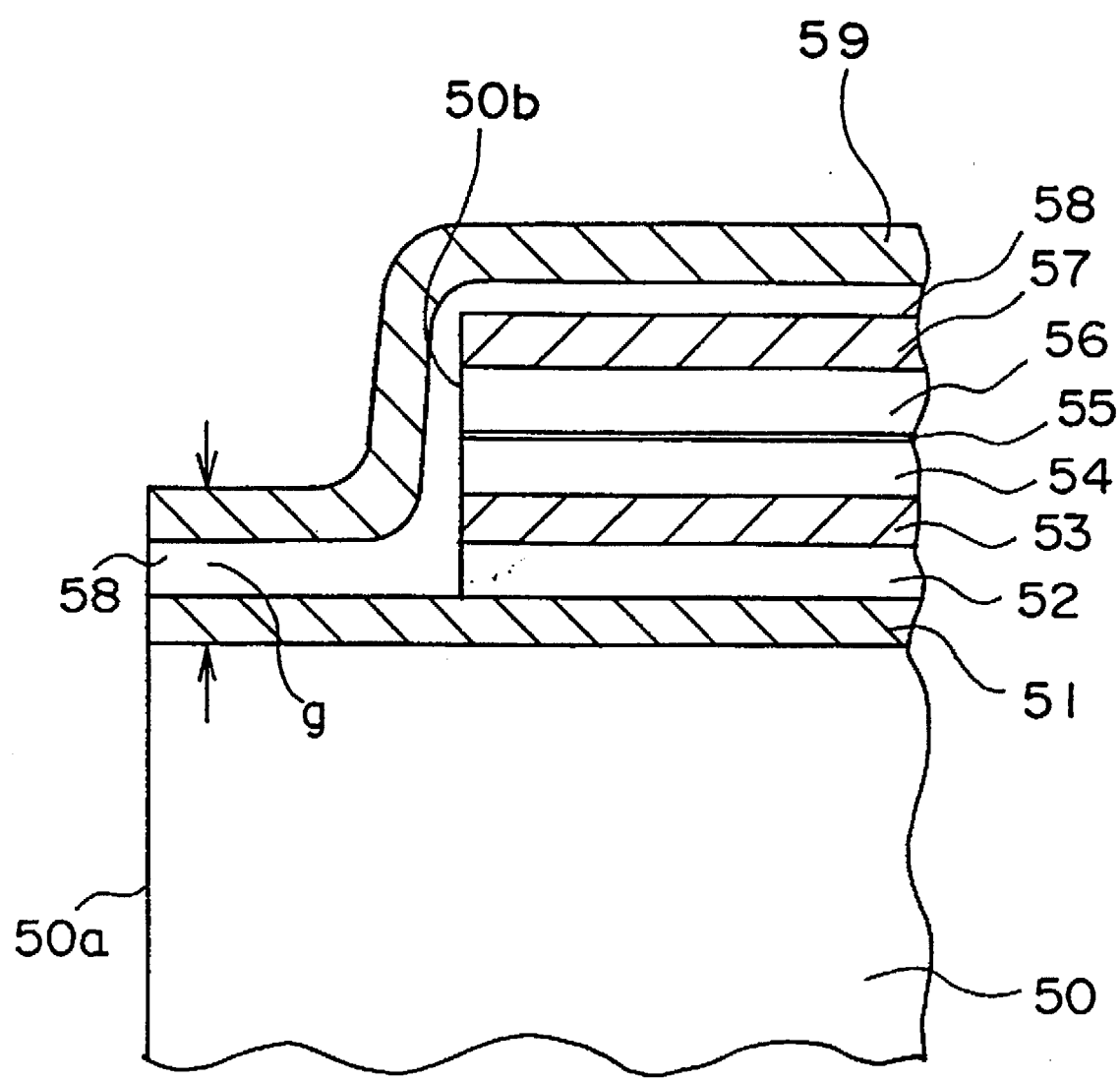
FIG. 11 is a diagram showing a thin-film magnetic head according to a second embodiment of the present invention in which the Hall-effect magnetic sensor of the first embodiment is incorporated.

Referring to FIG. 11, the thin-film magnetic head is formed on a glass substrate 50 adjacent to an edge surface 50a thereof and includes a lower pole piece 51 of a Fe—Ni alloy provided on a principal surface of the substrate 50 by an electroplating process. The lower pole piece 51 carries thereon an insulation layer 52 of $SiO_2$ or SiN defined by a side edge, such that the side edge is offset from the foregoing edge surface 50a. The insulation layer 52, in turn, carries thereon consecutively a conductor layer 53 of a material such as Cu and forming a part a coil, and another insulation layer 54 formed on the conductor layer 53 and having a composition similar to the layer 52. Further, the insulation layer 54 supports thereon a Hall-effect magnetic sensor 55 having a structure shown in FIG. 10. It should be noted that the insulation layers 52 and 54 may be formed by a CVD process, while the conductor layer 53 is formed by an electroplating process. Further, the Hall-effect magnetic sensor 55 is bonded upon the insulation layer by means of adhesive.

On the Hall-effect magnetic sensor 55 thus formed, another insulation layer 56 of $SiO_2$ or SiN is formed by a CVD process, and a conductor layer 57 similar to the conductor layer 53 is formed on the insulation layer 56 by means of an electroplating process as a part of the coil. Thereby, the layers 52–57 form a layered body having a common edge surface 50b offset from the edge surface 50a of the substrate 50. The layered body in turn is covered by another insulation layer 58 of $SiO_2$ or SiN, deposited by a CVD process, and an upper pole piece 59 is formed on the insulation layer 58 by an electroplating process of a Fe—Ni alloy.

In the structure of FIG. 11, it will be noted that the upper pole piece 59 and the lower pole piece 51 approach with each other at the edge surface 50a of the substrate to form a magnetic gap g having a thickness determined by the thickness of the insulation layer 58. On the other hand, the pole pieces 51 and 59 are connected with each other at the respective opposite edges not illustrated in FIG. 11. In such a construction, it is possible to form the width of the magnetic gap g to be extremely small, typically smaller than b 50nm, because of the reduced thickness of the Hall-effect magnetic sensor 55. Thus, the magnetic head of the present embodiment is suitable for a high density recording exceeding a recording density of 20 Gbits/inch² by energizing the coil formed by the foregoing conductor layers 53 and 57. Further, such a magnetic head can detect magnetic flux from an extremely small magnetization spot formed on the magnetic recording medium as a result of the high density recording exceeding the recording density of 20 Gbits/inch², by means of the Hall-effect magnetic sensor 55 disposed close to the magnetic gap g.

In the Hall-effect magnetic sensor of FIG. 10, it should be noted that the quantum well layer 36 is not limited to the materials described but other semiconductor materials having other compositions may also be used. For example, one may use InGaAs for the quantum well layer 36 in combination of InAlAs that forms the barrier layers 33, 35, 37 and 39. Further, one may use GaAs for the quantum well layer 36 in combination with InGaP for the barrier layers 33, 35, 37 and 39.

Further, one may eliminate the delta-doped layer 34 in the event the substrate 31 is left under the semiconductor layered body 30, as the surface depletion layer extending from the lower side does not reach the quantum well layer 36 in such a construction.

Further, the present invention is not limited to the embodiments described heretofore, but various variations and modifications may be made without departing from the scope of the invention.

What is claimed is:

1. A Hall-effect magnetic sensor, comprising:

a first barrier layer of an undoped semiconductor material defined by first and second, mutually opposing principal surfaces and having a first bandgap;

a quantum well layer provided on said second principal surface of said first barrier layer, said quantum well layer being defined by first and second, mutually opposing principal surfaces and formed of an undoped semiconductor material having a second bandgap substantially smaller than said first bandgap;

a second barrier layer of an undoped semiconductor material defined by first and second, mutually opposing principal surfaces and having a third bandgap substantially larger than said second bandgap;

at least one of said first and second barrier layers including a delta-doped layer of a dopant having a thickness of several atomic layers or less;

a source electrode provided on said quantum well layer in ohmic contact therewith, said source electrode injecting carriers into said quantum well layer;

a drain electrode provided on said quantum well layer in ohmic contact therewith, said drain electrode recovering carriers from said quantum well layer;

a first Hall electrode provided on said first principal surface of said first barrier layer; and a second Hall electrode provided on said second principal surface of said second barrier layer;

said first and second Hall electrodes detecting a Hall voltage appearing in said quantum well layer.

2. A Hall-effect magnetic sensor as claimed in claim 1, wherein said first barrier layer, said quantum well layer and said second barrier layer form a layered semiconductor body such that said layered semiconductor body has a thickness of 70 nm or less between said first principal surface of said first barrier layer and said second principal surface of said second barrier layer.

3. A Hall-effect magnetic sensor as claimed in claim 1, wherein each of said first and second barrier layers includes therein said delta-doped layer.

4. A Hall-effect magnetic sensor as claimed in claim 1, wherein said delta-doped layer contains the dopant with a sheet density of about $1 \times 10^{12}$ $cm^{-2}$.

5. A thin-film magnetic head, comprising:

a substrate;

a lower pole piece provided on said substrate, said lower pole piece having first and second ends;

an upper pole piece provided on said lower pole piece with a separation from said lower pole piece by a space formed between said upper and lower pole pieces, said upper pole piece having third and fourth ends respectively corresponding to said first and second ends, said upper pole piece being connected, at said fourth end, to said second end of said pole piece;

said upper and lower pole pieces defining a magnetic gap between said first and second ends;

magnetic energization means provided in said space between said lower pole piece and said upper pole piece, for creating a magnetic flux, in response to a recording signal, along a magnetic circuit that passes through said first and second pole pieces including said magnetic gap; and a Hall-effect magnetic sensor provided between said upper and lower pole pieces, said Hall-effect magnetic sensor comprising:

a first barrier layer of an undoped semiconductor material defined by first and second, mutually opposing principal surfaces and having a first bandgap;

a quantum well layer provided on said second principal surface of said first barrier layer, said quantum well layer being defined by first and second, mutually opposing principal surfaces and formed of an undoped semiconductor material having a second bandgap substantially smaller than said first bandgap;

a second barrier layer of an undoped semiconductor material defined by first and second, mutually opposing principal surfaces and having a third bandgap substantially larger than said second bandgap;

at least one of said first and second barrier layers including a delta-doped layer of a dopant having a thickness of several atomic layers or less;

a source electrode provided on said quantum well layer in ohmic contact therewith, said source electrode injecting carriers into said quantum well layer;

a drain electrode provided on said quantum well layer in ohmic contact therewith, said drain electrode recovering carriers from said quantum well layer;

a first Hall electrode provided on said first principal surface of said first barrier layer; and a second Hall electrode provided on said second principal surface of said second barrier layer;

said first and second Hall electrodes detecting a Hall voltage appearing in said quantum well layer.

6. A thin-film magnetic head as claimed in claim 5, wherein said magnetic gap has a value of 50 nm or less.

* * * * *